United States Patent
Aggarwal et al.

(10) Patent No.: US 7,585,142 B2
(45) Date of Patent: Sep. 8, 2009

(54) SUBSTRATE HANDLING CHAMBER WITH MOVABLE SUBSTRATE CARRIER LOADING PLATFORM

(75) Inventors: Ravinder Aggarwal, Gilbert, AZ (US); Jeroen Stoutjesdijk, Bussum (NL)

(73) Assignee: ASM America, Inc., Phoenix, AZ (US)

( * ) Notice: Subject to any disclaimer, the term of this patent is extended or adjusted under 35 U.S.C. 154(b) by 124 days.

(21) Appl. No.: 11/724,853

(22) Filed: Mar. 16, 2007

(65) Prior Publication Data

US 2008/0226428 A1 Sep. 18, 2008

(51) Int. Cl.
*B65G 49/07* (2006.01)
(52) U.S. Cl. ............... 414/217; 414/411; 414/937
(58) Field of Classification Search ............... 414/160, 414/217, 331.05, 416.08, 937, 411
See application file for complete search history.

(56) References Cited

U.S. PATENT DOCUMENTS

| | | | |
|---|---|---|---|
| 3,260,381 A | 7/1966 | Wagner et al. | |
| 4,815,912 A | 3/1989 | Maney et al. | |
| 4,886,412 A | 12/1989 | Wooding et al. | |
| 4,995,430 A | 2/1991 | Bonora et al. | |
| 5,180,273 A | 1/1993 | Sakaya et al. | |
| 5,407,449 A | 4/1995 | Zinger | |
| 5,464,313 A | 11/1995 | Ohsawa | |
| 5,547,328 A | 8/1996 | Bonora et al. | |
| 5,653,565 A | 8/1997 | Bonora et al. | |
| 5,740,845 A | 4/1998 | Bonora et al. | |
| 5,855,681 A | 1/1999 | Maydan et al. | |
| 5,857,827 A * | 1/1999 | Asakawa et al. ............ 414/779 |
| 5,934,856 A * | 8/1999 | Asakawa et al. ............ 414/217 |
| 5,944,940 A * | 8/1999 | Toshima ................. 156/345.29 |
| 6,007,675 A * | 12/1999 | Toshima ................. 156/345.32 |
| 6,079,927 A * | 6/2000 | Muka ......................... 414/217 |
| 6,102,647 A | 8/2000 | Yap | |
| 6,244,812 B1 | 6/2001 | Patterson et al. | |
| 6,261,044 B1 | 7/2001 | Fosnight et al. | |
| 6,267,853 B1 | 7/2001 | Dordi et al. | |
| 6,284,986 B1 | 9/2001 | Dietze et al. | |
| 6,439,822 B1 | 8/2002 | Kimura et al. | |

(Continued)

FOREIGN PATENT DOCUMENTS

JP 63-102225 5/1988

(Continued)

OTHER PUBLICATIONS

Slettehaugh et al., "Impact of Lot Buffering on Overall Equipment Effectiveness", *Semiconductor International*; Jul. 1998; 5 pages.

*Primary Examiner*—Charles A Fox
(74) *Attorney, Agent, or Firm*—Knobbe, Martens, Olson & Bear, LLP

(57) ABSTRACT

An apparatus for processing substrates may include a substrate handling chamber having a substrate load port on a side wall, and a movable platform movably engaged with the handling chamber between a first position and a second position. The first position is such that a substrate carrier on the movable platform is inaccessible by a substrate handling robot inside the chamber. The second position is near to the load port such that a substrate carrier on the movable platform is accessible by a substrate handling robot inside the handling chamber. The movable platform is configured to rotate about a generally vertical axis between the first and second positions.

14 Claims, 3 Drawing Sheets

U.S. PATENT DOCUMENTS

| | | |
|---|---|---|
| 6,447,232 B1 | 9/2002 | Davis et al. |
| 6,501,070 B1 | 12/2002 | Bacchi et al. |
| 6,519,502 B2 | 2/2003 | Chao |
| 6,549,825 B2 | 4/2003 | Kurata |
| 6,582,174 B1 | 6/2003 | Hayashi |
| 6,592,318 B2 * | 7/2003 | Aggarwal ................ 414/217.1 |
| 6,607,602 B1 | 8/2003 | Granneman et al. |
| 6,610,993 B2 * | 8/2003 | Meyhofer et al. ........ 250/559.4 |
| 6,632,068 B2 | 10/2003 | Zinger et al. |
| 6,634,116 B2 | 10/2003 | Kato et al. |
| 6,663,332 B1 * | 12/2003 | Sluijk et al. ................. 414/160 |
| 6,678,583 B2 | 1/2004 | Nasr et al. |
| 6,748,293 B1 * | 6/2004 | Larsen ....................... 700/218 |
| 6,897,124 B2 | 5/2005 | Tate et al. |
| 6,902,647 B2 | 6/2005 | Hasper |
| 6,979,165 B2 * | 12/2005 | Larson et al. .......... 414/226.05 |
| 6,981,832 B2 * | 1/2006 | Zinger et al. ................ 414/217 |
| 7,028,565 B2 | 4/2006 | Birkner et al. |
| 2002/0037645 A1 | 3/2002 | Matsunaga et al. |
| 2003/0091409 A1 * | 5/2003 | Danna et al. ................ 414/217 |
| 2003/0194297 A1 | 10/2003 | Sackett et al. |
| 2003/0235486 A1 | 12/2003 | Doherty et al. |
| 2005/0063797 A1 | 3/2005 | Lero et al. |
| 2005/0079042 A1 | 4/2005 | Maeda |
| 2005/0220575 A1 * | 10/2005 | Oono et al. ................. 414/217 |
| 2005/0232727 A1 | 10/2005 | Ferrara |
| 2006/0045662 A1 * | 3/2006 | Aalund et al. ............... 414/217 |
| 2006/0045663 A1 | 3/2006 | Aggarwal et al. |
| 2006/0045664 A1 | 3/2006 | Niewmierzycki et al. |

FOREIGN PATENT DOCUMENTS

| | | |
|---|---|---|
| JP | 63-143105 | 6/1988 |
| JP | 5-047896 | 2/1993 |
| WO | WO 99/38199 | 7/1999 |
| WO | WO 01/80289 A1 | 10/2001 |

* cited by examiner

SUBSTRATE HANDLING CHAMBER WITH MOVABLE SUBSTRATE CARRIER LOADING PLATFORM

BACKGROUND OF THE INVENTION

1. Field of the Invention

The present invention generally relates to apparatuses for processing substrates, and more particularly to front-end interfaces for delivering substrates to and retrieving substrates from semiconductor processing equipment.

2. Description of the Related Art

A typical reactor for processing semiconductor substrates includes a front-end interface at which substrates are moved between substrate carriers and internal chambers of the reactor, such as a deposition chamber. SEMI standards require carriers, such as front-opening unified pods (FOUPs), to be delivered to the reactor in a particular orientation and location. As a result, loads ports are typically located linearly along a front wall of the front-end interface. A robot within a substrate handling chamber of the reactor transfers substrates between the carriers positioned at the load ports and locations within the reactor.

SUMMARY OF THE INVENTION

This application relates in certain embodiments to apparatuses and methods for processing substrates.

In accordance with one embodiment, an apparatus for processing substrates comprises a substrate handling chamber having a substrate load port sized and shaped to allow one or more substrates to be transferred through the load port, and a movable platform configured to support a substrate carrier thereon. The movable platform is movably engaged with the handling chamber between a first position and a second position. The first position is such that a substrate carrier on the movable platform is inaccessible by a substrate handling robot inside the chamber. The second position is near the load port so that a substrate carrier on the movable platform is accessible by a substrate handling robot inside the handling chamber. The movable platform is configured to rotate about a generally vertical axis between the first and second positions.

In another embodiment, an apparatus for processing substrates comprises a substrate handling chamber having a substrate load port sized and shaped to allow one or more substrates to be transferred through the load port, and a movable platform configured to support a substrate carrier thereon. The movable platform is movably engaged with an exterior of the handling chamber between a first position and a second position. The first position is such that a substrate carrier on the movable platform is inaccessible by a substrate handling robot inside the chamber. The second position is near the load port so that a substrate carrier on the movable platform is accessible by a substrate handling robot inside the handling chamber. The apparatus further comprises at least two stationary substrate load platforms positioned near the exterior of the handling chamber. The movable load platform is substantially linearly aligned with the stationary load platforms when in the first position and misaligned with the stationary load platforms in the second position.

In another embodiment, an apparatus for processing substrates comprises a substrate handling chamber having a substrate load port sized and shaped to allow one or more substrates to be transferred through the load port, and a movable platform configured to support a substrate carrier thereon. The movable platform is movably engaged with an exterior of the handling chamber between a first position and a second position. The first position is such that a substrate carrier on the movable platform is inaccessible by a substrate handling robot inside the chamber. The second position is near the load port so that a substrate carrier on the movable platform is accessible by a substrate handling robot inside the handling chamber. The movable platform is configured to change its rotational orientation about a generally vertical axis between the first and second positions.

In another embodiment, an apparatus for processing substrates comprises a substrate handling chamber and a movable platform movably engaged with the handling chamber. The handling chamber has a front wall, a side wall that is not linearly aligned with the front wall, and a substrate load port located on the side wall. The movable platform has a first position and a second position. The platform in the first position is nonadjacent to the load port. The platform in the second position is substantially adjacent to the load port.

In another embodiment, a method for transporting substrates comprises providing a substrate handling chamber having a substrate load port sized and shaped to allow one or more substrates to be transferred through the load port; supporting a substrate carrier on a movable platform; and rotating the movable platform about a generally vertical axis to move the substrate carrier between a first location and a second location. The first location is inaccessible to a substrate handling robot inside the substrate handling chamber. The second location is accessible to the substrate handling robot through the load port.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the present invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

Further objects, features and advantages of the invention will become apparent from the following detailed description taken in conjunction with the accompanying figures showing illustrative embodiments of the invention, in which.

DETAILED DESCRIPTION OF THE PREFERRED EMBODIMENT

The embodiments described below relate to apparatuses and methods for processing substrates. Similar references numerals will be used to designate similar components in the different embodiments.

Figure 1:
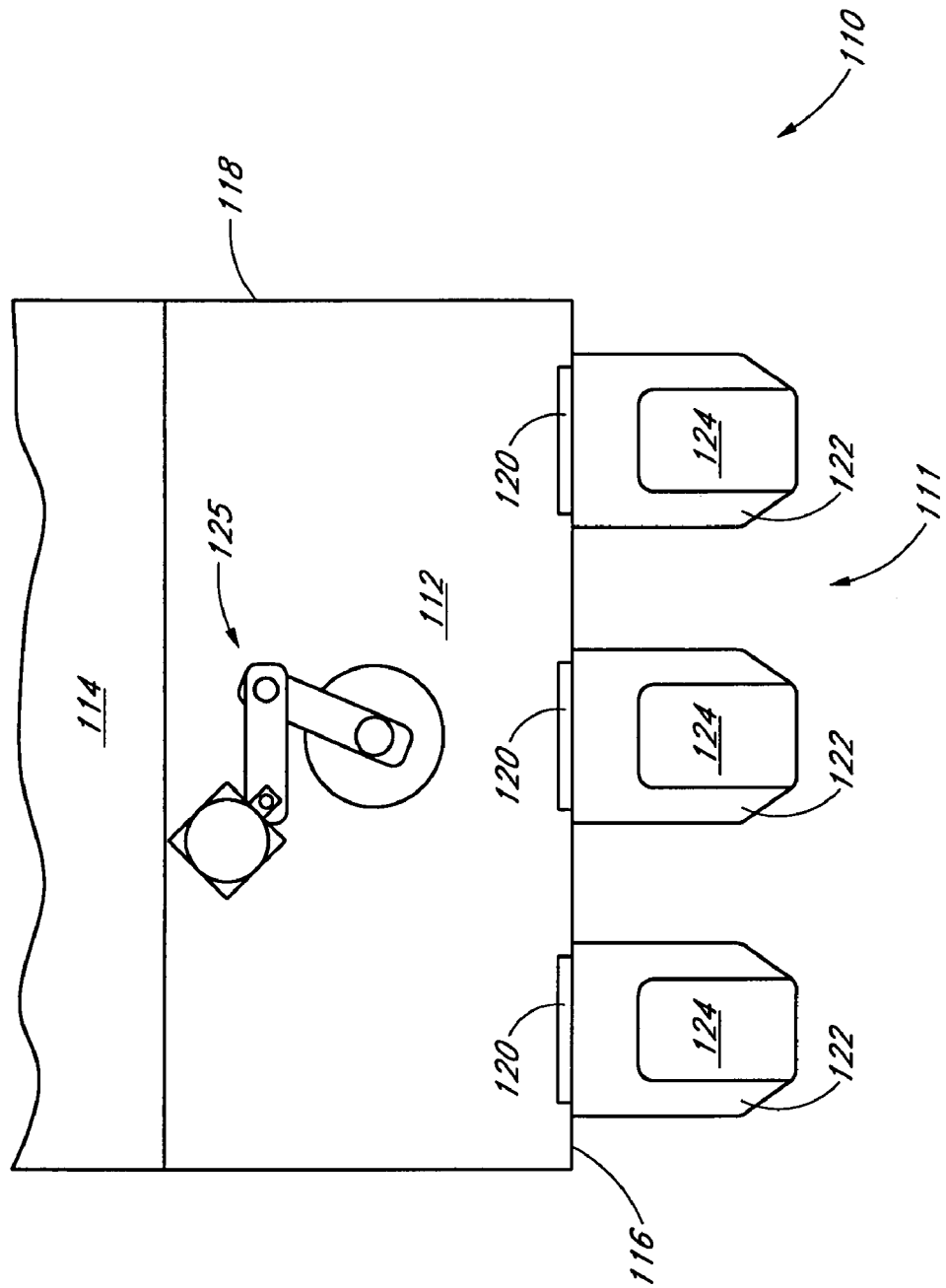
FIG. 1 is a plan view of an apparatus constructed in accordance with the prior art.

FIG. 1 shows a front end of a conventional semiconductor processing system 110, which includes front-end interface 111 and other semiconductor processing equipment 114, e.g., load locks, wafer transfer chamber, processing chambers, etc. The front-end interface 111 has a substrate handling chamber 112, a front wall 116, a side wall 118, and a number of load ports 120 and load platforms 122.

The load ports 120 are sized and shaped to allow one or more substrates to be transferred through the load ports 120. The load platforms 122 extend from the front wall 116 at locations near the load ports 120. Each load platform 122 is configured to support a substrate carrier 124, such as a front-opening unified pod (FOUP). The substrate carriers 124 may be configured to hold substrates spaced apart in a stack and isolate the substrates from ambient particulate and molecular contamination. The substrate carriers 124 are opened to permit a transfer robot 125 in the substrate handling chamber 112 to move the substrates through the load ports 120 between the carriers 124 and the processing equipment 114. The operation of substrate carriers and FOUPs in particular is explained in greater detail in U.S. Publication No. 2006/0045663 published Mar. 2, 2006, the entirety of which is hereby incorporated herein by reference.

Ordinarily, the system 110 includes one to four load ports 120. SEMI standards require carriers 124 to be delivered to the system 110 in a particular orientation and location. Therefore the loads ports 120 are typically located linearly along the front wall 116 of the front-end interface 111. The side wall 118 of the system 110 is typically left unimpeded by equipment or other items, so that technicians can access all of the components of the system 110 for maintenance and repair purposes.

These factors frequently lead to a system with a large footprint and require use of a large robot 125, particularly for reactors designed to process larger substrates. Because the transfer robot must be able to reach substrates positioned at all of the load ports, the required stroke for the robot leads to a complex robot design often including a track on which the robot moves. This can result in a slow and expensive robot. These slow robots and large footprints reduce the overall "throughput" (i.e., the rate at which substrates can be processed) of the facility.

Figure 2:
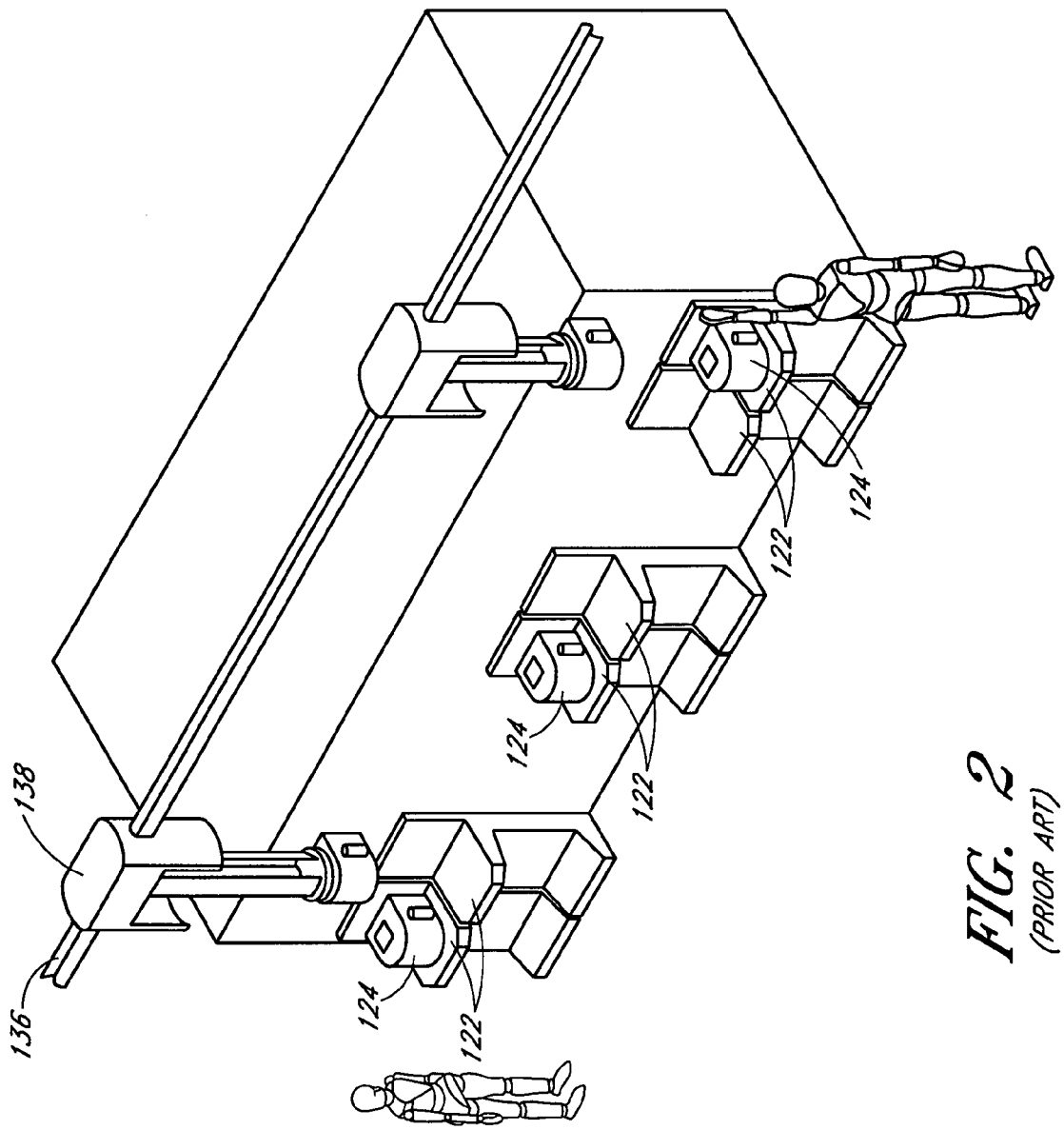
FIG. 2 is a perspective view of an apparatus and delivery mechanism in accordance with the prior art.

With reference to FIGS. 1 and 2, another consideration is that conventional mechanisms for delivering substrate carriers 124 onto the load platforms 122 typically involve a linear track 136 that requires the load platforms 122 to be arranged linearly. For example, the track 136 is typically positioned above or in front of the load platforms 122 to permit a delivery device 138 to deposit or retrieve substrate carriers 124 on load platforms 122, as illustrated in FIG. 2.

Therefore, a need exists for a front-end interface having a reduced footprint and allowing use of a smaller, simpler transfer robot without necessitating use of an unconventional delivery device, preventing maintenance access to the system, or decreasing the number of load platforms or load ports.

Figure 3:
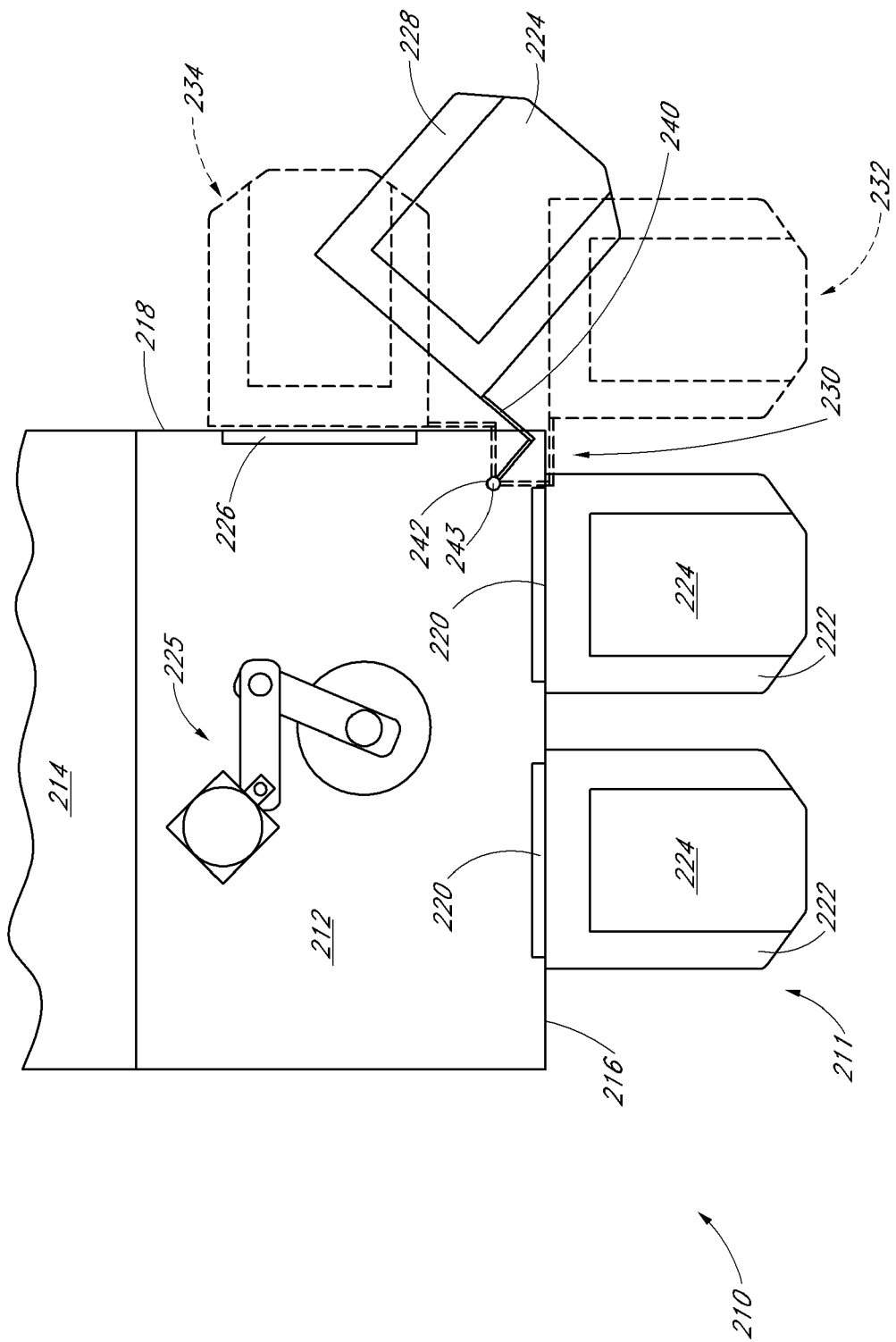
FIG. 3 is plan view of an apparatus constructed in accordance with one embodiment.

FIG. 3 shows a front-end interface 211 of a semiconductor processing system 210 according to one embodiment of the present invention. The system 210 may include other processing equipment 214. The front-end interface 211 may include a substrate handling chamber 212, a front wall 216, a side wall 218, one or more front load ports 220, one or more preferably stationary front load platforms 222 corresponding to front load ports 220, a side load port 226, and a movable load platform 228.

The load ports 220, 226 are preferably sized and shaped to allow one or more substrates to be transferred through the load ports 220, 226. Each load platform 222, 228 may be configured to support a substrate carrier 224, such as a front-opening unified pod (FOUP). Substrates may be moved through the load ports 220, 226 by a transfer robot 225 in the substrate handling chamber 212 between the carriers 224 and the processing equipment 214.

The front load ports 220 may be located on the front wall 216. The side load port 226 may be located on the side wall 218. The front wall 216 and the side wall 218 may be generally perpendicular or may intersect at angles greater or less than 90°.

The front load platforms 222 may extend from the front wall 216 of the interface 211 at locations near the front load ports 220. The movable load platform 228 may be moveably attached to the front-end interface 211 near a corner 230 of the interface 211. In one embodiment, the movable platform 228 is hingedly secured to the corner 230 by an L-shape arm 240 connected to a hinge 242, as shown in FIG. 3. In other embodiments, an arm having a shape other than an L-shape may be used or the movable platform 228 may be hingedly secured to the front-end interface 211 without using an arm. For example, the movable platform 228 may be hingedly secured to the front-end interface 211 by a hinge connected to a perimeter of the movable platform 228.

The movable load platform 228 is preferably rotatably movable between at least a first position 232 and a second position 234. In the first position 232, the movable platform 228 is preferably substantially linearly aligned with the front load platforms 222 in front of the front wall 216. When in the first position 232, the movable load platform 228 may receive a carrier 224 from a delivery mechanism in accordance with location and orientation requirements of the SEMI standards. The delivery mechanism in one embodiment is an overhead transport that moves along a linear track, such as the one illustrated in FIG. 2. Referring to FIG. 3, in the second position 234 the movable platform 228 may be sufficiently near the side load port 226 on the side wall 218 to permit substrates within a carrier 224 on movable platform 228 to be accessible through the port 226 to the transfer robot 225 within the handling chamber 212. Between the first position 232 and the second position 234, the movable platform 228 may be rotated about a generally vertical axis such that its rotational orientation changes from that required by the SEMI standards for the delivery of carriers 224 to one that permits a carrier 224 on movable platform 228 to interface with the side load port 226. In some embodiments, the generally vertical axis may pass through the movable platform 228, while in the illustrated embodiment the axis 243 passes through the hinge 242 that is located beyond the perimeter of the platform 228. In other embodiments, the generally vertical axis may be located at the perimeter of the movable platform. For example, a hinge may be connected to the movable platform 228 at the perimeter of the movable platform 228.

The front-end interface 211 may be less wide and therefore smaller than interface 111 of the conventional system 110, thereby reducing the footprint of the system without decreasing the total number of load ports. Front-end interface 211 may also permit the use of a smaller and less complex transfer robot 225 than robot 125 of interface 111, because the robot 225 does not require a range as large as that of robot 125. Furthermore, a technician may access the sidewall 218 of the front-end interface 211 for maintenance or repair by simply rotating the movable load platform 228 to the first position 232.

In one embodiment, a front-end interface 211 may be used to transport substrates. The front-end interface 211 has a substrate handling chamber 212 and a side load port 226 sized and shaped to allow one or more substrates to be transferred through the port 226. A substrate carrier 224 is received from a delivery mechanism and supported on a movable platform 228. The movable platform 228 rotates about a generally vertical axis to move the substrate carrier 224 between a first location 232 and a second location 234. Movement of the movable platform 228 may include rotation about a hinge 242.

When the movable platform 228 is at the first location 232, the substrates in the carrier 224 (supported on the platform 228) are typically inaccessible to the substrate handling robot 225 inside the substrate handling chamber. When the movable platform 228 moves to the second location 234, the substrates within carrier 224 are accessible to the substrate handling robot 225 through the side load port 226. The robot 225 may remove a substrate from the carrier 224 through the load port 226 and move the substrate into the processing equipment 214. The robot 225 may transfer a substrate from the processing equipment 214 through the load port 226 into the carrier 224.

Although certain preferred embodiments and examples have been described herein, it will be understood by those skilled in the art that the present inventive subject matter extends beyond the specifically disclosed embodiments to other alternative embodiments and/or uses of the invention and obvious modifications and equivalents thereof. Thus, it is intended that the scope of the present inventive subject matter herein disclosed should not be limited by the particular disclosed embodiments described above, but should be determined only by a fair reading of the claims that follow.

What is claimed is:

1. An apparatus for processing substrates comprising:
   a substrate handling chamber having a substrate load port sized and shaped to allow one or more substrates to be transferred through the load port; and
   a movable platform configured to
   a substrate carrier thereon, the movable platform being movably engaged with the handling chamber between a first position and a second position, the first position being such that a substrate carrier on the movable platform is inaccessible by a substrate handling robot inside the chamber, the second position being near to the load port so that a substrate carrier on the movable platform is accessible by a substrate handling robot inside the handling chamber, the movable platform configured to rotate on a hinge about a generally vertical axis between the first and second positions; and
   at least two stationary substrate load platforms accessible to a substrate handling robot inside the handling chamber, the movable load platform being linearly aligned with the stationary load platforms when in the first position and misaligned with the stationary load platforms when in the second position.

2. The apparatus of claim 1, wherein the generally vertical axis is located at or beyond the perimeter of the movable platform.

3. The apparatus of claim 1, wherein the chamber comprises a front wall and a side wall that is not linearly aligned with the front wall, the load port being located on the side wall.

4. The apparatus of claim 3, wherein the side wall is substantially perpendicular to the front wall.

5. The apparatus of claim 3, further comprising:
   a front load port on the front wall; and
   a stationary platform engaged with the exterior of the handling chamber near the front load port, the stationary platform being accessible by a substrate handling robot inside the handling chamber.

6. The apparatus of claim 1, further comprising a substrate handling robot inside the substrate handling chamber, the robot configured to transport substrates through the load port between a substrate carrier on the movable platform in the second position and an interior of the substrate handling chamber.

7. An apparatus for processing substrates, comprising:
   a substrate handling chamber having a substrate load port sized and shaped to allow one or more substrates to be transferred through the load port;
   a movable platform configured to support a substrate carrier thereon, the movable platform being movably engaged with an exterior of the handling chamber between a first position and a second position, the first position being such that a substrate carrier on the movable platform is inaccessible by a substrate handling robot inside the chamber, the second position being near the load port so that a substrate carrier on the movable platform is accessible by a substrate handling robot inside the handling chamber; and
   at least two stationary substrate load platforms positioned near the exterior of the handling chamber, the movable load platform being substantially linearly aligned with the stationary load platforms when in the first position and misaligned with the stationary load platforms in the second position.

8. The apparatus of claim 7, wherein the movable load platform rotates on a hinge.

9. The apparatus of claim 7, wherein the handling chamber includes a front wall and a side wall, the side wall being not linearly aligned with the front wall, the load port being located on the side wall.

10. The apparatus of claim 9, further comprising at least two front load ports in the front wall, each front load port positioned near one of the stationary substrate load platforms so that a substrate handling robot inside the handling chamber can access substrate carriers supported on each stationary platform through one of the front load ports.

11. An apparatus for processing substrates, comprising:
    a substrate handling chamber having a substrate load port sized and shaped to allow one or more substrates to be transferred through the load port; and
    a movable platform configured to support a substrate carrier thereon, the movable platform being movably engaged with an exterior of the handling chamber between a first position and a second position, the first position being such that a substrate carrier on the movable platform is inaccessible by a substrate handling robot inside the chamber, the second position being near the load port so that a substrate carrier on the movable platform is accessible by a substrate handling robot inside the handling chamber, the movable platform configured to change its rotational orientation about a generally vertical axis between the first and second positions;
    wherein the handling chamber comprises a front wall and a side wall, the side wall being not linearly aligned with the front wall, the load port being located on the side wall;
    a front load port on the front wall; and
    a stationary platform engaged to the exterior of the handling chamber and accessible through the front load port by a substrate handling robot inside the handling chamber.

12. The apparatus of claim 11, wherein the movable load platform rotates on a hinge.

13. A method for transporting substrates, comprising:
providing a substrate handling chamber having a substrate load port sized and shaped to allow one or more substrates to be transferred through the load port;
supporting a substrate carrier on a movable platform; and
rotating the movable platform on a hinge about a generally vertical axis to move the substrate carrier between a first location and a second location, the first location being inaccessible to a substrate handling robot inside the substrate handling chamber, the second location being accessible to the substrate handling robot through the load port;
wherein the first location is adjacent to a front wall of the handling chamber, the second location being adjacent to a side wall of the handling chamber, the side wall is oriented generally transverse with respect to the front wall.

14. The method of claim 13, wherein the first location linearly aligns the movable platform with at least two stationary substrate load platforms, and the second location misaligns the movable platform with the at least two stationary load platforms.

* * * * *